(12) United States Patent
Igel et al.

(10) Patent No.: US 6,413,474 B1
(45) Date of Patent: Jul. 2, 2002

(54) MEASURING DEVICE

(75) Inventors: Günter Igel, Teningen; Ulrich Sieben, Reute; Jürgen Giehl, Kirchzarten; Bernhard Wolf, Stegen, all of (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/441,769

(22) Filed: Nov. 17, 1999

(30) Foreign Application Priority Data

Nov. 17, 1998 (DE) .......................................... 198 52 967

(51) Int. Cl.$^7$ .............................................. G01N 15/06
(52) U.S. Cl. .................... 422/82.05; 257/783; 257/778; 257/702; 438/1; 438/149; 438/656; 438/42; 438/17; 324/754; 204/403; 422/68.1
(58) Field of Search ...................... 422/82.05; 257/783, 257/778, 702, 723; 438/1, 149, 42, 17, 656; 324/754; 204/403

(56) References Cited

U.S. PATENT DOCUMENTS

| | | | |
|---|---|---|---|
| 5,798,567 A | * | 8/1998 | Kelly et al. .................. 257/723 |
| 5,821,762 A | * | 10/1998 | Hamaguchi et al. ......... 324/754 |
| 5,858,808 A | * | 1/1999 | Igel et al. ...................... 438/42 |
| 5,885,897 A | * | 3/1999 | Igel .............................. 438/656 |
| 5,933,715 A | * | 8/1999 | Igel et al. .................... 438/149 |
| 5,939,783 A | * | 8/1999 | Laine et al. ................. 257/702 |
| 5,976,901 A | * | 11/1999 | Igel .............................. 438/17 |
| 6,025,648 A | * | 2/2000 | Takahashi et al. ........... 257/778 |
| 6,033,916 A | * | 3/2000 | Sieben et al. .................. 438/1 |
| 6,093,971 A | * | 7/2000 | Oppermann et al. ......... 257/783 |
| 6,191,489 B1 | * | 2/2001 | Igel et al. .................... 257/778 |
| 6,280,586 B1 | * | 8/2001 | Wolf et al. ................. 204/403 |

FOREIGN PATENT DOCUMENTS

| | | |
|---|---|---|
| DE | 198 10 060 A1 | 11/1998 |
| DE | 198 14 857 A1 | 10/1999 |
| EP | 0 172 669 A1 | 2/1986 |
| WO | WO 98 05935 A1 | 2/1998 |

* cited by examiner

*Primary Examiner*—Jill Warden
*Assistant Examiner*—Brian Sines
(74) *Attorney, Agent, or Firm*—Akin, Gump, Strauss, Hauer & Feld, L.L.C.

(57) ABSTRACT

A measuring device (1) has a semiconductor arrangement, which includes a semiconductor chip (2) connected to a carrier (4) having at least one through-hole (3). The semiconductor chip (2) has at least one sensor (6) with an active sensor surface (5) facing the through-hole (3). The semiconductor chip (2) has electrical terminal points (9), which are connected using flip-chip connections (10) to terminal contacts (11) facing the terminal points (9) and located on the carrier (4). The carrier (4) has electrical strip conductors (12), which connect the terminal contacts (11) to contact elements (13) located on the carrier. To the rear side of the carrier (4) having the contact elements (13) a strip conductor carrier (16) is provided, which has strip conductors (12) connected to opposing contacts (14). The opposing contacts (14) are each electrically connected using flip-chip connections (17), to a contact element (13), which are allocated to each of them. The semiconductor chip (2) and the carrier (4) enclose a measuring chamber. Between the carrier (4) and the semiconductor chip (2) a seal (7) is arranged, which is constructed to be porous or semi-porous, at least in certain areas, or is constructed as a selectively permeable membrane, for bringing a substance into the measuring chamber.

18 Claims, 3 Drawing Sheets

MEASURING DEVICE

BACKGROUND OF THE INVENTION

The invention relates to a measuring device having at least one semiconductor arrangement including a semiconductor chip connected to a carrier having at least one through-hole. The semiconductor chip has at least one sensor with an active sensor surface facing the through-hole and has electrical terminal points connected using flip-chip connections to terminal contacts located on the carrier and facing the terminal points. The carrier has electrical strip conductors which connect the terminal contacts to contact elements on the carrier. At least one strip conductor carrier is provided having opposing contacts connected to the contact elements and to strip conductors, at least a portion of the strip conductor carrier being arranged on the rear of the carrier and having contact elements with opposing contacts facing the contact elements of the carrier. The opposing contacts of the strip conductor carrier are connected using flip-chip connections to the contact elements of the carrier, which are allocated to each of them. The semiconductor chip and the carrier enclose a measurement chamber, and a seal is arranged between the carrier and the semiconductor chip.

A measuring device of this type is known from John H. Lau, *Flip Chip Technologies*, pages 260 and 261, McGraw-Hill (1995). There, the through-hole is covered on one of its axial ends by the semiconductor chip and on its other axial end by the strip conductor carrier. In the coverage area the strip conductor carrier has openings connected to supply and discharge channels for a fluid to be investigated which is conducted through the measuring chamber. On the rear side of the carrier, facing away from the semiconductor chip, the strip conductor carrier is connected by an adhesive layer to the edge area of the carrier that surrounds the through-hole. Between the semiconductor chip and the carrier a gap is formed, in which polymer bumps are arranged, which connect the terminal points of the semiconductor chip to the terminal contacts of the carrier respectively allocated to them. Between the active sensor surface and the polymer bumps a sealing ring is arranged as a seal, which seals off the fluid located in the test space from the polymer bumps and the rear side of the semiconductor chip facing away from the active sensor surface. The sealing ring has a sealing surface on each of its flat sides, one of which rests on the semiconductor chip and the other rests on the carrier.

Measuring devices of this type are used, for example, for chemical and/or biological tests on a medium located in the measuring chamber. It is necessary during the measurement, for certain tests therein, to bring two different substances into the through-hole simultaneously, but separated from each other, and to supply them to the sensor, for example if these substances react chemically with each other and this chemical reaction should be monitored using the sensor. In the previously known device, however, different substances in the fluid stream can only be supplied together, i.e., the substances must already have been brought into contact with each other outside the measurement chamber.

A measuring device of the type set forth at the outset is also already known from German published patent application DE 198 10 060 A1. There, the semiconductor chip is constructed as an active structural component, which releases a substance upon heating. In addition, an additional substance can be brought into the measuring chamber through the opening of the through-hole. The measuring device, however, has the disadvantage that, in addition to the chip area on the semiconductor chip which is necessary for the sensor, additional space must be provided in order to accommodate the substance to be released, and possibly the heating unit for heating up this substance. Since the costs for manufacturing a semiconductor chip increase superproportionally with the increase in size of the chip area, the measuring device is comparably more expensive. Also, with the selection of the substance to be released certain limitations must be taken into account, since not all substances allow for a release upon heating. Finally, the measurement result can also be affected by the introduction of heat.

SUMMARY OF THE INVENTION

Thus, an object of the invention is to create a measuring device of the type described at the beginning, which allows a compact construction and has accesses to the measuring chamber that are independent from each other. This object is achieved in that the seal for bringing a substance into the measuring chamber is constructed to be porous or semi-porous at least in certain areas. Through the seal, for example, an active substance can be brought into the test space formed by the through-hole of the carrier, for example to examine the effect of the active substance on the biological cells located there using the sensor of the semiconductor chip. The porous or semi-porous material of the seal may comprise, for example, aluminum oxide ceramic. The material preferably has pores or holes which permit transmission of substances or particles having sizes in the micrometer range. On the rear side of the seal, facing away from the through-hole, a reservoir, for example, can be arranged for the active substance or equivalent substance to be brought into the through-hole, and/or the seal is connected on the rear side to a supply channel for the substance. Optionally, the porous or semi-porous seal can also function as a filter for a medium to be brought into the through-hole.

The object mentioned above can also be achieved in that the seal for bringing a substance into the measuring chamber is constructed as a selectively permeable membrane. It is thereby possible to allow only certain chemical substances, which can diffuse through the membrane, to pass through the gap, and to prevent other substances from passing through the gap. The membrane thereby allows a sealing off of the through-hole located on the front side of the semiconductor chip, from the rear side of the semiconductor chip. Through the membrane, for example, certain active substances can be supplied to biological components located in the through-hole and arranged in a nutrient medium or an osmotic protective medium, in order to examine the reaction of the biological components using the semiconductor sensor. Gas-permeable membranes can, for example, be made of polyethylene permeable to hydrogen, lanthanum fluoride permeable to fluorine, or zirconium oxide permeable to oxygen. Other permeable materials for the membrane may include, for example, polyvinylchloride, polytetrafluoroethylene, or silicone rubber. The membrane arranged in the gap can have a directionally-dependent permeability.

The seal can be constructed as a form seal, which has one or more windows that leave open certain areas of the semiconductor chip. Also, the seal can project inwardly beyond the wall of the carrier that surrounds the surface plane of the through-hole, and in certain areas it can cover the cross-section of the through-hole. The area of the seal that projects inwardly beyond the edge of the carrier through-hole can then function as a support for a connection piece located in or insertable into the through-hole. The connection piece can have inlet and/or outlet openings for the medium to be tested and, optionally, can be part of a pump housing.

One embodiment of the invention provides that the seal is formed by a castable substance (potting compound) poured into the gap located between the semiconductor chip and the carrier. This allows a mechanically stable bond between the semiconductor chip and the carrier. Thus, for example, under excess pressure of a medium located in the through-hole, the pressure forces acting on the semiconductor chip can be transmitted to the carrier over a large area via the castable substance arranged on the peripheral edge of the semiconductor chip. In particular, the mechanical load on the flip-chip connections is also reduced thereby.

It is advantageous if the seal is optically transparent and/or is penetrated by at least one fiber optic light guide. It is thereby possible to illuminate the test space formed by the through-hole by going through seal, so that a medium located there can be observed optically. By the seal and/or the light guide, however, light signals can also be conducted out of the test space to the outside, for example with fluorescence of a specimen located in the through-hole.

Another embodiment of the invention provides that the semiconductor chip has an optical, in particular an image-transmitting sensor, and that at least one optical lens and/or at least one optical filter is arranged in the through-hole. The filter and/or the lens can be manufactured during the production of the measuring device by dripping an optically transparent material on the semiconductor chip or on a layer on top of it. The optically transparent material can then optionally be dried or cured by a chemical reaction. The semiconductor chip and/or the carrier can have an evaluation device, a storage unit for storing the image data and/or an interface module for transmitting the image data to a display and/or storage device located outside of the measuring device. On the whole, an economically producible, compactly constructed camera results therefrom. It is even possible therein that the carrier be constructed as a chip card.

An especially advantageous embodiment of the invention provides that the carrier has a plurality of through-holes, each having a semiconductor chip arranged there. The individual semiconductor chips can then, for example, have chemical sensors, so that in a laboratory a plurality of specimens can be tested at the same time. It is even possible therein that different semiconductor chips be arranged on the individual through-holes and that these, in particular, have different sensors. In this way, one or more different specimens can be tested at the same time for different chemical properties.

It is advantageous if on the side of the carrier facing away from the semiconductor chip, a support is arranged for supporting a form tool for forming a container on the edge area of the carrier that surrounds the through-hole, and if on the area of the carrier which surrounds the support, a plastic that forms the wall of the container is sprayed on. The form tool can then be set down on the carrier during the manufacture of the container, so that it is spaced from the semiconductor chip located behind it. Damage to the sensitive sensor surface by the form tool is thereby avoided. In addition, a sealed connection between the form tool and the carrier is achieved on the support, so that when spraying the plastic around in the form tool, the plastic cannot come into contact with the active sensor surface. The container forms, together with the through-hole of the carrier, a receptacle which optionally can have a defined volume, into which can be brought a specimen to be investigated with the sensor.

An especially advantageous embodiment provides that the measuring device be constructed as a microtiter measuring device having a plurality of semiconductor arrangements. In this embodiment, the carriers of the individual semiconductor arrangements are expediently each connected on their front side facing away from the semiconductor chip to an upper part of a microtiter plate, especially using an adhesive layer. The carriers of the individual semiconductor arrangements herein can also optionally be connected to each other as a single piece. As the microtiter plate upper part, a commercially available standard microtiter plate can optionally be provided. In order to fill the individual specimen containers of the microtiter measuring device, sampling devices already present in laboratories can then be used.

It should also be mentioned that in addition to the sensor of the semiconductor chip, optionally at least one sensor can be provided on the carrier as well, e.g., an ion-selective field effect transistor and/or an electrode. The carrier can also, however, have a treatment device for bio-components or similar specimens to be brought into the through-hole, which can include, for example, a heating unit and/or a cooling device. Furthermore, the carrier can have a transmitter and/or receiver for data transfer to an external control and/or evaluation (analysis) device.

The carrier can have contact elements, which are connected to the terminal contacts of the carrier using the strip conductors located on the carrier, wherein the carrier is at least partially made of a flexible or plastically deformable material for changing the position of the contact elements relative to the terminal contacts. The contact elements can then be connected to connections of an evaluation unit and/or a power supply unit adapted thereto, wherein the position of the contact elements can be adapted to the respective local conditions by deforming the carrier at the mounting site of the semiconductor arrangement. Thus, it is possible, for example, to pivot the terminal contacts relative to the plane of the chip and relative to the semiconductor chip by bending the carrier, so that the terminal contacts can be arranged, according to each situation on the mounting site, either on the front side of the semiconductor chip, laterally of the semiconductor chip and/or on its rear side.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE INVENTION

Figure 2:
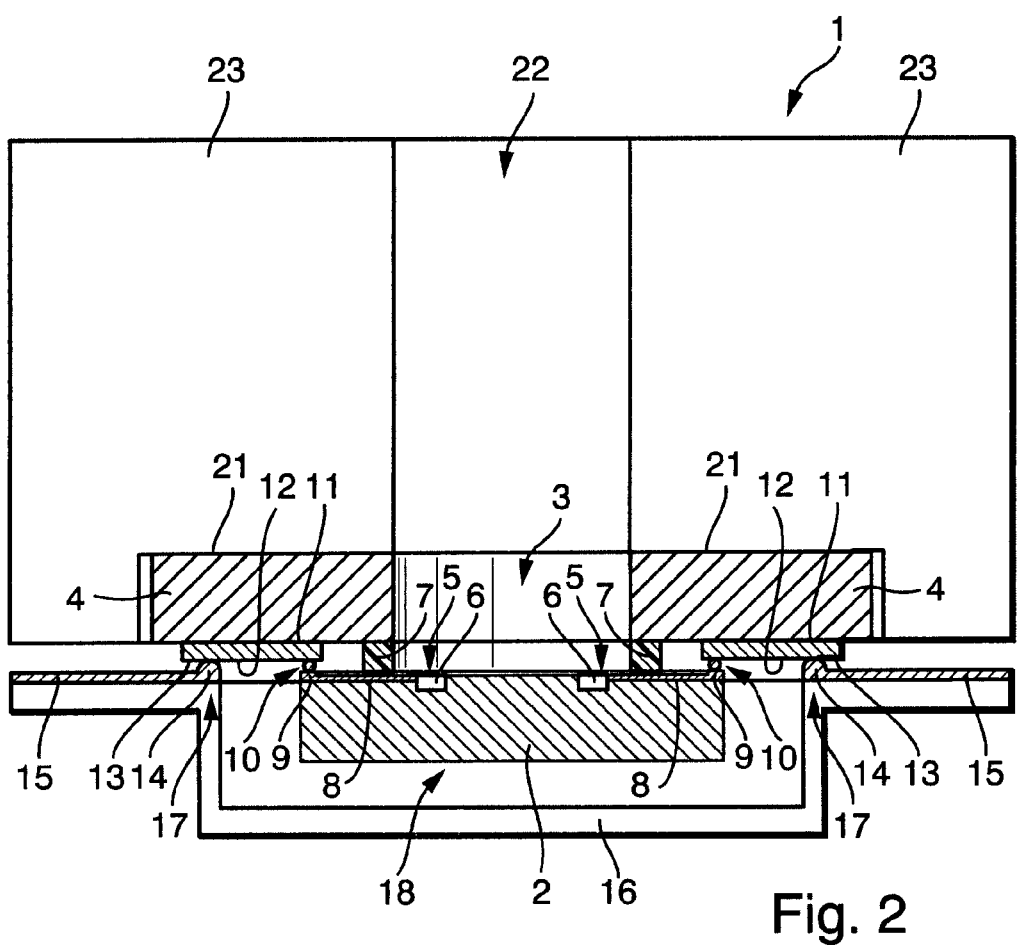
FIG. 2 is a cross-sectional side view of a measuring device with the semiconductor arrangement shown in FIG. 1, wherein a strip conductor carrier is arranged on the rear side of the carrier which faces the semiconductor chip, and a container for receiving a specimen is arranged on the front side of the semiconductor chip.
Figure 4:
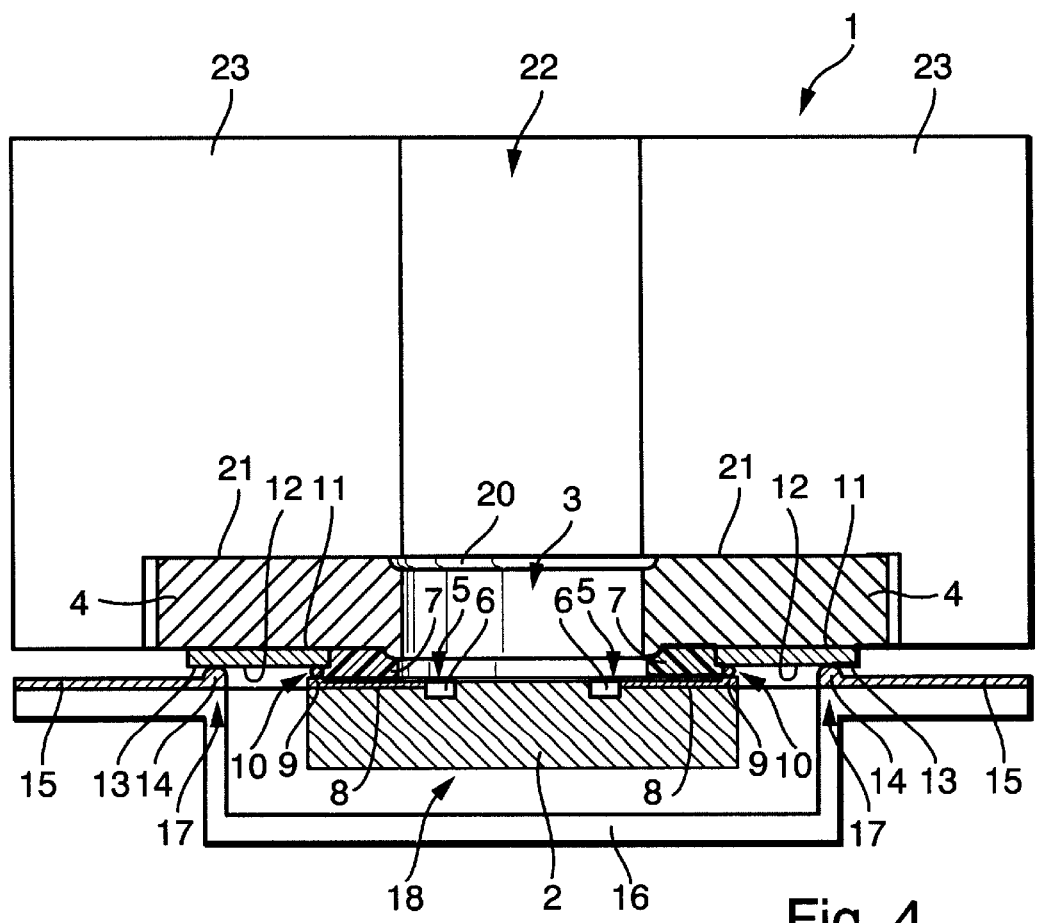
FIG. 4 is a representation similar to FIG. 2 wherein, however, a castable substance is arranged between the semiconductor chip and the carrier.
Figure 5:
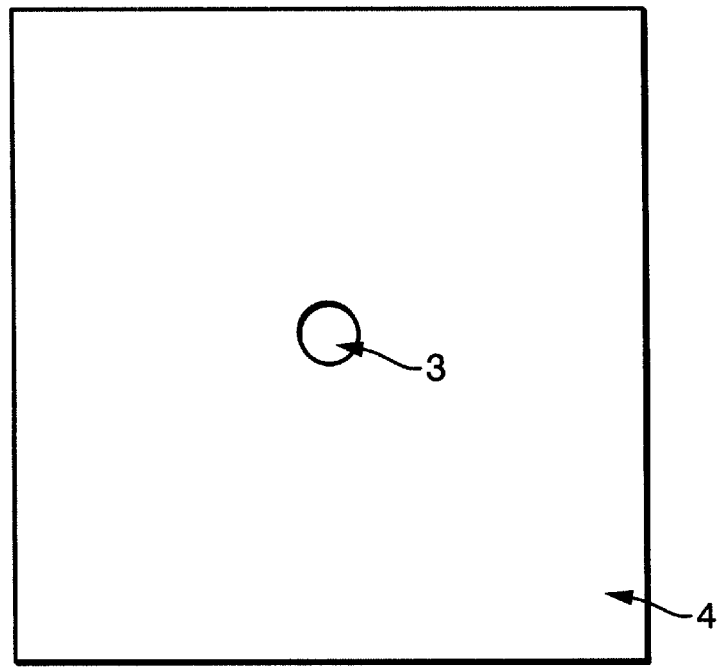
FIG. 5 is a top plan view of the semiconductor chip arrangement according to FIGS. 1 and 3.
Figure 6:
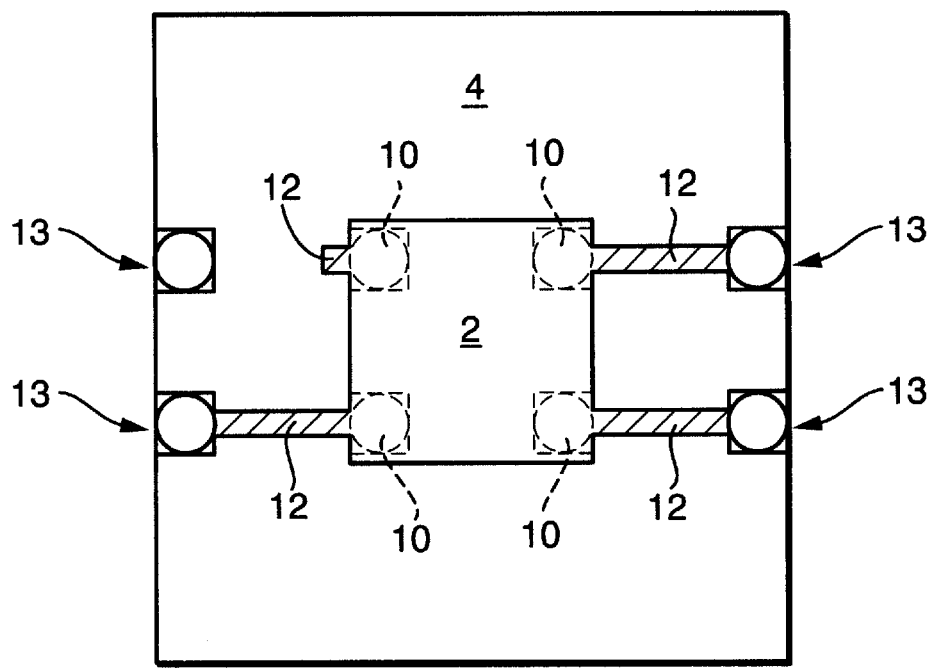
FIG. 6 is a view from below of the semiconductor arrangement according to FIGS. 1 and 3.

A measuring device, designated as a whole by 1, has a semiconductor arrangement which includes a semiconductor chip 2 connected to a carrier 4 having a through-hole 3. As can be seen in FIGS. 2 and 4, the carrier 4 is constructed essentially in a plate or disk shape and has on each of its flat sides that face away from each other an opening that is formed by the through-hole 3.

The semiconductor chip 2 has several sensors 6 on an active sensor surface 5. These can include, for example, ion-selective field effect transistors, interdigital capacitors, electrodes, temperature sensors, sensors for measuring a gas content, optical sensors and/or other chemical or physical sensors.

The semiconductor chip 2 is arranged on a flat side of the carrier 4 with the active sensor surface 5 facing the through-hole 3. Between the carrier 4 and the semiconductor chip 2 a gap is formed, in which a seal 7 is arranged that surrounds the lower opening of the through-hole 3 and seals off a medium, which is to be examined and can be brought into the through-hole 3 from the rear side of the semiconductor chip 2 facing away from the active sensor surface 5.

The semiconductor chip 2 has electric strip conductors 8, which connect the sensors 6 to terminal points 9 that face the carrier 4 and are located in the gap. The terminal points 9 are each connected by a flip-chip connection 10 arranged in the gap to a connection contact 11 of a strip conductor 12 of the carrier 4, which is allocated to them. The strip conductors 12 can, for example, lead to an evaluation device or a power supply unit and/or be connected to terminal contacts 11 leading to other terminal points 9 of the semiconductor chip 2.

In the embodiments according to FIGS. 2 and 4, the strip conductors 12 of the carrier 4 have contact elements 13, which are connected to opposing contacts 14 of a strip conductor carrier 16 having strip conductors 15. The strip conductor carrier 16 is arranged on the rear side of the carrier 4 that has the contact elements 13, wherein the opposing contacts 14 are facing the contact elements 13 of the carrier 4 and are electrically connected to them using flip-chip connections 17. The terminal points 9 of the semiconductor chip 2 are thus connected to each other and/or to the terminal points 9 of other semiconductor arrangements or electrical components, both using the strip conductors 12 of the carrier 4 and the strip conductors 15 of the strip conductor carrier 16.

The wiring of the terminal points 9 is thus done in two planes, so that the density of the strip conductors is reduced. The measuring device 1 thus allows an especially compact construction. It is particularly possible therein to arrange close together on the strip conductor carrier 16 a plurality of semiconductor arrangements, each having a semiconductor chip 2 and a carrier 4 connected to the chip. The flip-chip connections 10, 17 arranged, on the one hand, between the semiconductor chip 2 and the carrier 4 and, on the other hand, between this carrier and the strip conductor carrier 16, allow, in addition, a simple manufacture and assembly of the measuring device 1. In particular, the flip-chip technology can be integrated well into the manufacturing process of the semiconductor chip 2, the carrier 4, and the strip 1 conductor 16. The flip-chip connections 10, 17 can have bumps, which optionally can be affixed to the strip conductors 8, 12, 15.

In the embodiments according to FIGS. 2 and 4, the strip conductor carrier 16 has on its front side facing the semiconductor chip 2 a recess 18, in which the semiconductor chip 2 is arranged. In the area of the recess 18, the strip conductor carrier 16 encloses the rear side of the semiconductor chip 2 facing away from the active sensor surface 5. In the area of the strip conductor carrier 16 which encloses the rear side of the semiconductor 2, strip conductors 15 can be arranged. The space located on the rear side of the semiconductor chip 2 can thereby be used for the wiring of the terminal points 9 of the semiconductor chip 2 or other electric components of the measuring device 1.

Figure 1:
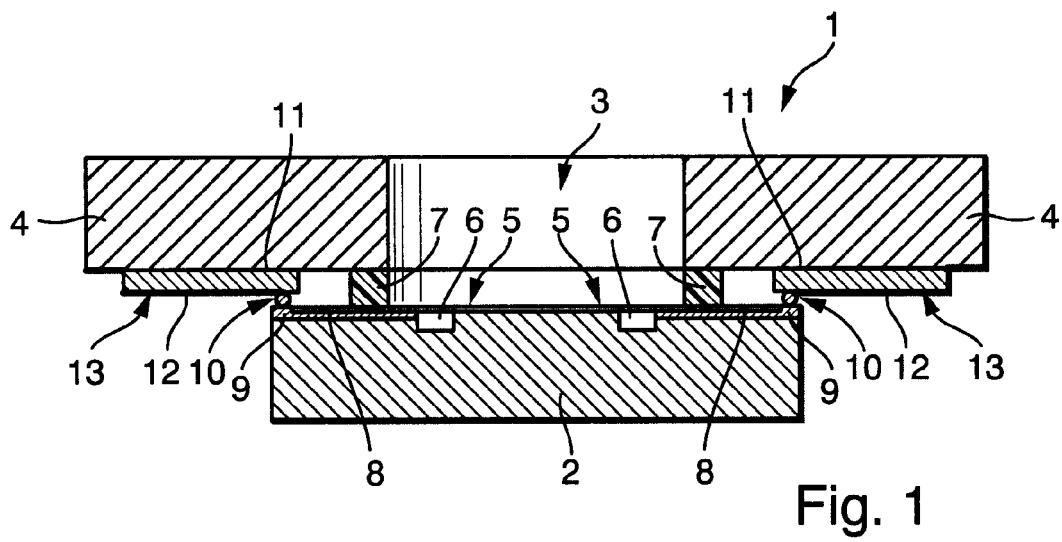
FIG. 1 is a cross-sectional side view through a semiconductor arrangement with a carrier having a through-hole and a semiconductor chip that covers the through-hole.

In the embodiment according to FIGS. 1 and 2 a sealing ring is provided as a seal 7, whose inner wall facing the through-hole 3 comprises a porous material, in whose pores a biologically active substance is contained. This active substance is released upon contact with a nutrient liquid filled in the through-hole 3, having in it biological components to be examined, for example to feed the biological components over a longer time period.

Figure 3:
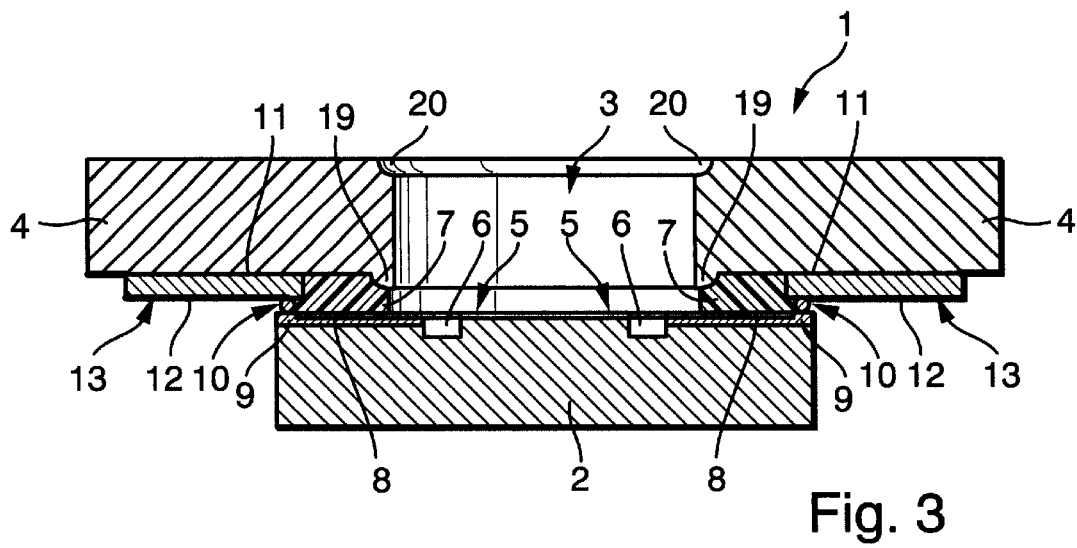
FIG. 3 is a representation similar to FIG. 1 wherein, however, a castable substance is arranged in the gap formed between the semiconductor chip and the carrier.

In the embodiment according to FIGS. 3 and 4 the seal 7 is a membrane, which is formed from a castable substance poured through a gap formed between the semiconductor chip 2 and the carrier 4. In the manufacture of the measuring device 1 the semiconductor chip 2 is arranged in such a way on the carrier 4 that, between the semiconductor chip 2 and the carrier 4, a capillary gap is formed which preferably runs around the through-hole 3. On the outer edge of the gap facing away from the through-hole, a membrane material dissolved in a solvent is then filled, as a castable substance, into the gap from the rear side of the carrier 4. The solvent is then removed, e.g., by evaporation. For example, the castable substance may be a hydrogel comprising a membrane-forming polymer (e.g., polyvinyl alcohol) dissolved or suspended in water, which is subsequently removed by drying. The gap width and/or the viscosity of the castable substance can be adjusted to achieve the desired capillary action. For example, the gap width for a castable substance having a relative viscosity of 30 to 60 may be on the order of several micrometers.

It is even possible in this process that the castable substance be poured at only one position of the outer periphery of the gap and then be spread out by capillary action in the extension direction of the gap in a ring-shape around the through-hole 3. In an advantageous way, the castable substance stops, when it is poured into the gap, at the inner edge of the gap facing the through-hole 3 by the capillary action ending there. Contact of the castable substance with the active sensor surface 5 of the sensors 6, and thus damage to the function of the sensors 6, is thereby avoided. The castable substance forms a membrane in the gap, which is permeable only for certain chemical substances and, in addition, seals off the through-hole located on the front side of the semiconductor chip from the rear side of the semiconductor chip.

As can be recognized especially well from FIG. 3, the carrier 4 has in the area of the gap a projection 19 projecting beyond the surface plane of the surface of the carrier 4 facing the semiconductor chip 2. This projection is arranged at the inner wall of the seal 7 facing the through-hole 3 and runs around the through-hole 3. In the area of the projection 19 the clearance width of the gap formed between the carrier 4 and the semiconductor chip 2 is reduced. It is thereby achieved that, even when filling a thin liquid castable substance into the gap, the castable substance stops at the inner edge of the gap facing the through-hole 3 by the capillary action ending there. In this process, the castable substance can optionally also be washed into the gap.

The projection 19 has in cross-section the approximate shape of a ¼-circular segment and terminates on its inner side facing the through-hole 3 flush with the surface plane of the inner wall of the carrier 4 that encloses the through-hole 3. Progressing from the outer to the inner edge of the gap, the clearance width of the gap is constantly reduced in the area of the projection 19. The projection 19 can be stamped into the carrier 4. In FIG. 3 it can be clearly recognized that, on the front side of the carrier 4 facing away from the projection, a stamped recess 20 formed complementary to the projection is present.

In the embodiments according to FIGS. 2 and 4 the carrier has on its front side facing away from the semiconductor chip 2 an adhesive layer 21, which is connected to the underside of a container 23 having a hole 22. Thus, the carrier 4 is positioned on the container 23 in such a way that the hole 22 of the container 23 aligns with the through-hole 3 of the carrier 4. As can be recognized from FIGS. 2 and 4, the container 23 has a recess on its underside, into which the carrier 4 is inserted. The hole 22 and the through-hole 3 form a receptacle space for a specimen to be examined by the sensors 6. The container 23 can be a microtiter plate upper part, which has a plurality of holes 22, on each of which is positioned a semiconductor arrangement having a semiconductor chip 2 and a carrier 4 with a through-hole 3.

It should also be mentioned that the strip conductors 8, 12, 15 can also be imprinted, vapor-deposited, or formed as a conductive layer. Optionally, the semiconductor chip 2, the carrier 4 and/or the strip conductor carrier 16 can have strip conductors 8, 12, 15 arranged in several locations.

The carrier 4 can have a light transparent layer or be completely transparent to light. In addition, the carrier 4 can have a chemical reservoir.

If the sensor 6 is, for example, a Hall sensor, a stabilizing layer protecting the sensor surface can be arranged in the through-hole 3. Around this arrangement a mechanically stable cast-on layer can be provided in a conventional manner, which can contain quartz particles or the like as filling material. Since this cast-on layer, however, no longer comes into direct contact with the sensor surface, damages are avoided by the filling material.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A measuring device (1) comprising at least one semiconductor arrangement including a semiconductor chip (2) and a carrier (4) connected thereto, the carrier having at least one through-hole (3) and the semiconductor chip (2) having at least one sensor (6) with an active sensor surface (5) facing the through-hole (3), the semiconductor chip (2) having electrical terminal points (9) connected by flip-chip connections (10) to terminal contacts (11) located on the carrier (4) and facing the terminal points (9), the carrier (4) having electrical strip conductors (12) which connect the terminal contacts (11) to contact elements (13) located on the carrier (4), and at least one strip conductor carrier (16) being provided with strip conductors (15) having opposing contacts (14) connected to the contact elements (13), at least a portion of the strip conductor carrier (16) being arranged on a rear side of the carrier (4) having the contact elements (13), with the opposing contacts (14) facing the contact elements (13) and being connected by flip-chip connections (17) to the contact elements (13) allocated to each of them, wherein the through-hole (3) and an area of the semiconductor chip (2) exposed by the through-hole (3) in the carrier (4) define a measuring chamber, and a seal (7) is arranged between the carrier (4) and the semiconductor chip (2), and wherein the seal (7) is constructed to be porous or semi-porous, at least in certain areas, for bringing a substance into the measuring chamber.

2. A The measuring device according to claim 1, wherein the seal (7) is formed by a castable substance poured into a gap located between the semiconductor chip (2) and the carrier (4).

3. The measuring device according to claim 1, wherein the seal (7) is optically transparent and/or is penetrated by at least one fiber optic light guide.

4. The measuring device according to claim 1, wherein the semiconductor chip (2) has an optical, image-transmitting sensor, and at least one optical lens and/or at least one optical filter is arranged in the through-hole (3).

5. The measuring device according to claim 1, wherein the carrier (4) has a plurality of through-holes (3) each having a semiconductor chip (2) arranged thereon.

6. The measuring device according to claim 5, wherein different semiconductor chips (2) are arranged on individual through-holes (3) and have different sensors (6).

7. The measuring device according to claim 1, wherein a support is arranged on a side of the carrier (4) facing away from the semiconductor chip (2) for supporting a form tool for forming a container (23) on an edge area of the carrier (4) surrounding the through-hole (3), and a sprayed-on plastic forms the wall of the container (23) on an area of the carrier (4) surrounding the support.

8. The measuring device according to claim 1, wherein the device is constructed as a microtiter measuring device having a plurality of semiconductor arrangements.

9. The measuring device according to claim 1, wherein the carrier (4), on its front side facing away from the semiconductor chip (2), is connected to an upper part of a micro-titer plate using an adhesive layer.

10. A measuring device (1) comprising at least one semiconductor arrangement including a semiconductor chip (2) and a carrier (4) connected thereto, the carrier having at least one through-hole (3) and the semiconductor chip (2) having at least one sensor (6) with an active sensor surface (5) facing the through-hole (3), the semiconductor chip (2) having electrical terminal points (9) connected by flip-chip connections (10) to terminal contacts (11) located on the carrier (4) and facing the terminal points (9), the carrier (4) having electrical strip conductors (12) which connect the terminal contacts (11) to contact elements (13) located on the carrier (4), and at least one strip conductor carrier (16) being provided with strip conductors (15) having opposing contacts (14) connected to the contact elements (13), at least a portion of the strip conductor carrier (16) being arranged on a rear side of the carrier (4) having the contact elements (13), with the opposing contacts (14) facing the contact elements (13) and being connected by flip-chip connections (17) to the contact elements (13) allocated to each of them, wherein the through-hole (3) and an area of the semiconductor chip (2) exposed by the through-hole (3) in the carrier (4) define a measuring chamber, and a seal (7) is arranged between the carrier (4) and the semiconductor chip (2), and wherein the seal (7) is constructed as a selectively permeable membrane for bringing a substance into the measuring chamber.

11. The measuring device according to claim 10, wherein the seal (7) is formed by a castable substance poured into a gap located between the semiconductor chip (2) and the carrier (4).

12. The measuring device according to claim 10, wherein the seal (7) is optically transparent and/or is penetrated by at least one fiber optic light guide.

13. The measuring device according to claim 10, wherein the semiconductor chip (2) has an optical, image-transmitting sensor, and at least one optical lens and/or at least one optical filter is arranged in the through-hole (3).

14. The measuring device according to claim 10, wherein the carrier (4) has a plurality of through-holes (3) each having a semiconductor chip (2) arranged thereon.

15. The measuring device according to claim 14, wherein different semiconductor chips (2) are arranged on individual through-holes (3) and have different sensors (6).

16. The measuring device according to claim 10, wherein a support is arranged on a side of the carrier (4) facing away from the semiconductor chip (2) for supporting a form tool for forming a container (23) on an edge area of the carrier (4) surrounding the through-hole (3), and a sprayed-on plastic forms the wall of the container (23) on an area of the carrier (4) surrounding the support.

17. The measuring device according to claim 10, wherein the device is constructed as a microtiter measuring device having a plurality of semiconductor arrangements.

18. The measuring device according to claim 10, wherein the carrier (4), on its front side facing away from the semiconductor chip (2), is connected to an upper part of a microtiter plate using an adhesive layer.

* * * * *